(12) United States Patent
Yoshihara et al.

(10) Patent No.: US 8,390,173 B2
(45) Date of Patent: Mar. 5, 2013

(54) MEMS SWITCH AND METHOD OF MANUFACTURING THE MEMS SWITCH

(75) Inventors: Takaaki Yoshihara, Osaka (JP); Yoshiki Hayasaki, Osaka (JP); Takeo Shirai, Osaka (JP); Tomoaki Matsushima, Kizugawa (JP); Hiroshi Kawada, Neyagawa (JP); Yousuke Hagihara, Katano (JP)

(73) Assignee: Panasonic Corporation, Osaka (JP)

( * ) Notice: Subject to any disclaimer, the term of this patent is extended or adjusted under 35 U.S.C. 154(b) by 351 days.

(21) Appl. No.: 12/935,282
(22) PCT Filed: Mar. 30, 2009
(86) PCT No.: PCT/JP2009/056493
  § 371 (c)(1),
  (2), (4) Date: Sep. 28, 2010
(87) PCT Pub. No.: WO2009/123111
  PCT Pub. Date: Oct. 8, 2009

(65) Prior Publication Data
  US 2011/0024274 A1 Feb. 3, 2011

(30) Foreign Application Priority Data
  Mar. 31, 2008 (JP) .................. 2008-093595

(51) Int. Cl.
  *H01L 41/00* (2006.01)
  *H02N 1/00* (2006.01)
  *H02N 11/00* (2006.01)
(52) U.S. Cl. ......... 310/328; 310/309; 310/311; 310/344
(58) Field of Classification Search .................. 310/309, 310/311, 328, 344
  See application file for complete search history.

(56) References Cited

U.S. PATENT DOCUMENTS

| 5,479,042 A | 12/1995 | James et al. |
| 5,620,933 A | 4/1997 | James et al. |
| 5,627,396 A | 5/1997 | James et al. |
| 5,666,258 A | 9/1997 | Gevatter et al. |
| 6,806,545 B2 | 10/2004 | Shim |
| 7,782,170 B2 * | 8/2010 | Robert ............................ 337/85 |
| 7,911,299 B2 * | 3/2011 | Suzuki ........................... 335/78 |
| 2005/0280975 A1 | 12/2005 | Iwata et al. |
| 2006/0197635 A1 * | 9/2006 | Christenson .................... 335/78 |
| 2006/0226735 A1 * | 10/2006 | Ikehashi ....................... 310/311 |
| 2007/0024403 A1 * | 2/2007 | Kwon et al. .................... 335/78 |
| 2007/0188846 A1 * | 8/2007 | Slicker et al. ................. 359/290 |
| 2008/0017489 A1 | 1/2008 | Kawakubo et al. |
| 2008/0047816 A1 | 2/2008 | Kawakubo et al. |
| 2008/0078662 A1 * | 4/2008 | Naito et al. .................... 200/181 |
| 2008/0142348 A1 | 6/2008 | Nguyen et al. ................. 200/275 |
| 2009/0026880 A1 * | 1/2009 | Liu .............................. 310/309 |
| 2009/0296308 A1 * | 12/2009 | Kawakubo et al. ........... 361/290 |
| 2011/0148251 A1 * | 6/2011 | Piazza et al. .................. 310/317 |
| 2011/0181150 A1 * | 7/2011 | Mahameed et al. .......... 310/328 |

FOREIGN PATENT DOCUMENTS

JP 8-506690 A 7/1996
JP 8-509093 A 9/1996
(Continued)

OTHER PUBLICATIONS

International Search Report for the Application No. PCT/JP2009/056493 mailed Apr. 21, 2009.

*Primary Examiner* — Thomas Dougherty
(74) *Attorney, Agent, or Firm* — McDermott Will & Emery LLP

(57) ABSTRACT

The MEMS switch comprises a substrate with signal-lines having fixed-contacts, a movable-plate with a movable-contact, a flexible support-member supporting the movable-plate, a static-actuator and a piezoelectric-actuator configured to contact the movable-contact with the fixed-contact. The movable-contact is provided at its longitudinal center with the movable-contact, and its both the longitudinal ends with static-movable-electrode-plate. The support-member is four strips disposed on portions outside of the both width ends of the movable plate. The strip extends along the longitudinal direction of the movable plate, provided with a first end fixed to the movable plate, and provided with a second end fixed to the substrate. The piezoelectric-element is disposed on an upper surface of the strip to be located at a portion outside of the width ends of the movable-plate. The piezoelectric-actuator is configured to develop the stress applied to the coupling-portion which is created between each the strip and the movable-plate.

13 Claims, 9 Drawing Sheets

FOREIGN PATENT DOCUMENTS

| | | |
|---|---|---|
| JP | 2002-326197 A | 11/2002 |
| JP | 2004-71481 A | 3/2004 |
| JP | 2005-348199 A | 12/2005 |
| JP | 3852224 B2 | 9/2006 |
| JP | 2007-242462 A | 9/2007 |
| JP | 2008-27812 A | 2/2008 |
| JP | 2008-53077 A | 3/2008 |
| JP | 2008-68369 A | 3/2008 |

* cited by examiner

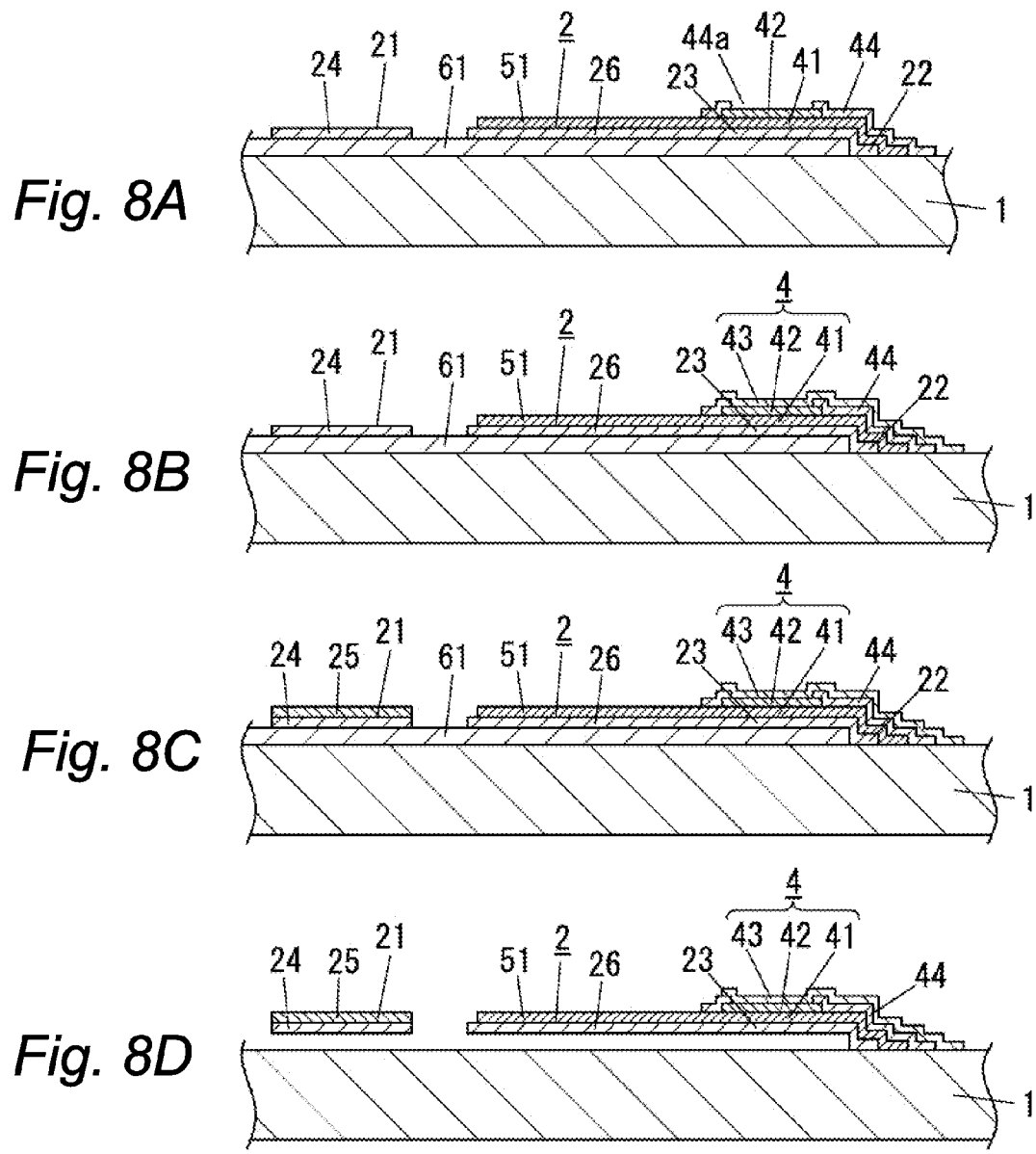

MEMS SWITCH AND METHOD OF MANUFACTURING THE MEMS SWITCH

TECHNICAL FIELD

This invention relates to a MEMS switch and a method of manufacturing the MEMS switch. (MEMS means a micro-electro-mechanical system.)

BACKGROUND ART

In the past, a MEMS switch for transmitting a high frequency signal which employs the static actuator is well known. Such the MEMS switch is disclosed in Japanese patent publication No. 3852224B.

The MEMS switch disclosed in the Japanese patent publication No. 3852224B comprises a substrate, a movable plate, a pair of signal wires, and a static actuator. The substrate is made of a glass. The movable plate comprises a movable contact. The substrate is provided at its upper surface with a strip. The strip has flexibility. The movable plate is supported by the substrate via the strip such that the movable plate is movable in a thickness direction of the substrate. Consequently, the movable contact is supported by the movable plate such that the movable contact is movable in the thickness direction of the substrate. A pair of the signal wires is disposed on the upper surface of the substrate. The signal wires are provided with fixed contacts, respectively. The fixed contacts are configured to come into contact with the movable contact when the movable contact is displaced in the thickness direction of the substrate. The static actuator is provided for displacing the movable plate such that the movable contacts moves toward the fixed contacts. The static actuator comprises a movable electrode and a fixed electrode. The movable electrode is disposed on the movable plate. The fixed electrode is disposed on the substrate to be located in an opposed relation to the movable electrode. The movable electrode is configured to come into contact with the fixed electrode when the voltage is applied between the movable electrode and the fixed electrode. In addition, the fixed electrode is provided at its upper surface with an electrically insulation film. The electrically insulation film is provided for prevention of the sticking of the movable electrode to the fixed electrode. The movable plate is made of silicon.

Furthermore, in the past, a MEMS switch comprising a static actuator and a piezoelectric actuator is also well known. The MEMS switch is used for transmitting the high frequency signal. The MEMS switch is configured to be operated by electrical power which is lower than electrical power for operation of the MEMS switch comprising only the static actuator. Such a MEMS switch is configured to allow the movable contact to move toward and away from the fixed contacts of a pair of the signal wires by means of the static actuator and the piezoelectric actuator. Such a MEMS switch is disclosed in Japanese patent application publication No. 2008-27812A.

The MEMS switch disclosed in the Japanese patent application publication No. 2008-27812A comprises a substrate, a pair of signal wires, and a flexible layer. The substrate is made of glass. A pair of the signal wires is disposed on the upper surface of the substrate. A pair of the signal wires is provided with fixed contacts. The flexible layer is provided with a first end and a second end. The first end of the flexible layer is fixed on the upper surface of the substrate. The second end of the flexible layer is provided with a movable contact. The movable contacts are configured to come into contact with the fixed contacts. The flexible layer is realized by a bimorph type piezoelectric actuator. The bimorph type piezoelectric actuator comprises a lower electrode, a lower piezoelectric layer, an intermediate electrode, an upper piezoelectric layer, and an upper electrode. The lower piezoelectric layer is made of AlN. The lower piezoelectric layer is disposed on the upper surface of the lower electrode. The intermediate electrode is disposed on the upper surface of the lower piezoelectric layer. The upper piezoelectric layer is made of AlN. The upper piezoelectric layer is disposed on the upper surface of the intermediate electrode. The upper electrode is disposed on the upper surface of the upper piezoelectric layer. The tip of the lower electrode also acts as the movable electrode of the static actuator. The fixed contact also acts as the fixed electrode of the static actuator.

DISCLOSURE OF THE INVENTION

Problem to be Resolved by the Invention

In the MEMS switch disclosed in the Japanese patent application No. 3852224B, the movable contact is spaced from the fixed contact by a sufficient distance in order to improve an isolation property. However, the sufficient distance between the movable contact and the fixed contact results in the requirement of a huge electrical power for allowing the movable contact to the fixed contact at a desirable pressure.

In contrast, the MEMS switch disclosed in the Japanese patent application publication No. 2008-27812A employs both the piezoelectric actuator and the static actuator. The piezoelectric actuator is configured to generate a large amount of displacement by a voltage which is lower than a voltage which is required for operation of the static actuator. Therefore, it is possible to contact the movable contact to the fixed contact at the desirable pressure. Consequently, the isolation property is improved. Furthermore, it is possible to obtain the MEMS switch which is operated by a low electrical power.

However, in this MEMS switch, the flexible layer acts as the piezoelectric actuator. The flexible layer is provided with the first end which is fixed to the upper surface of the substrate. The tip of the lower electrode of the piezoelectric actuator also acts as the movable electrode of the static actuator. The fixed contact also acts as the fixed electrode of the static actuator. That is, it is difficult to increase a contact area between the movable electrode and the fixed electrode. Therefore, it is difficult to operate the static actuator by a low electrical power. In addition, in the MEMS switch, the one end of the flexible layer is supported by the substrate. Therefore, only the tip of the flexible layer effectively acts as the fixed electrode. Therefore, an area of the fixed electrode is restricted. As a result, it is difficult to generate the desirable static force. Consequently, it is difficult to contact the movable electrode to the fixed electrode at the desirable pressure. In addition, when the MEMS switch is operated by the piezoelectric actuator, only the flexible layer is deformed. Similarly, when the MEMS switch is operated by the static actuator, only the flexible layer is deformed. Therefore, a large amount of the electrical power is required for contacting the movable contact to the fixed contact at a desirable pressure.

This invention is achieved to solve the above problem. An object in this invention is to produce a MEMS switch which achieves the following two objects at the same time. The first object is to reduce a parasitic capacitance between the movable contact and the fixed contact of the MEMS switch. The second object is to contact the movable contact to the fixed contact at the desirable pressure by a low electrical power. In addition, a further object in this invention is to produce a method of manufacturing the MEMS switch of the above.

Means of Solving the Problem

In order to solve the above problem, a MEMS switch in this invention comprises a substrate having an upper surface, a pair of signal wires, a movable plate, a support member, a static actuator, and a piezoelectric actuator. A pair of the signal wires has fixed contacts, respectively. The signal wires are located in an upper side of the substrate. The movable plate is located in an upper side of the substrate. The movable plate has a movable contact. The movable contact corresponds to said fixed contacts The support member has flexibility. The support member is configured to support the movable plate to be movable upward and downward relative to the substrate. The static actuator is configured to develop an electrostatic force for displacing the movable plate along a thickness direction of the substrate in order to allow the movable contact to come into contact with the fixed contacts. The piezoelectric actuator is configured to develop stress for displacing the movable plate in the thickness direction of the substrate in order to allow the movable contact to come into contact with the fixed contacts. The static actuator comprises a pair of static movable electrode plates and a pair of static fixed electrode plates. The static movable electrode plates are disposed on the movable plate. The static fixed electrode plates are disposed in an opposed relation to the static movable electrode plates. The piezoelectric actuator comprises a piezoelectric element. The piezoelectric element has a piezoelectric layer, a first electrode, and a second electrode. The first electrode is disposed on one surface of the piezoelectric layer and the second electrode is disposed on the other surface of said piezoelectric layer. The piezoelectric element is configured to be deformed when voltage is applied between said first electrode and said second electrode, thereby developing said stress. The movable plate has a length and a width. The movable plate is provided at its lengthwise center with the movable contact. The movable plate is provided at its both lengthwise ends with movable electrode holding portions. The static movable electrode plates are disposed on the movable electrode holding portions respectively. The support member comprises four strips. Each the strips has the flexibility. The strips are disposed at portions being located at outsides of both width ends of the movable plate and being located at outsides of the movable electrode holding portions. The strips are arranged along a lengthwise direction of the movable plate. Each the strip is provided with a first end and a second end which is opposite of said first end. Each first end is coupled to the movable plate. The second end is coupled to the substrate. Each the piezoelectric element is disposed on an upper surface of each the strip, whereby each the piezoelectric element is located in an outside of the both width ends of the movable plate. The piezoelectric elements apply the stress to coupling portions between the strip and the movable plate when the piezoelectric element develops the stress.

In this case, the movable contact is disposed on the upper surface of the substrate. The movable contact is located at a longitudinal center of the substrate. The static actuators are disposed on both the longitudinal ends of the substrate. Each one of the piezoelectric actuators is disposed at a portion outside of the both width side of the static actuator. Each one of the piezoelectric actuators extends along the longitudinal direction of the movable plate. Therefore, it is possible to reduce the parasitic capacitance which is created between the movable contact and the each the fixed contacts. In addition, the MEMS switch in this invention comprises the piezoelectric actuators and the static actuator. Each one of piezoelectric actuators is independent from the static actuator. Therefore, it is possible to ensure the sufficient dimension of the static actuator. Consequently, it is possible to reduce the operation voltage for operating the static actuator in order to ensure the desired contact force. In addition, the movable plate is spaced from the support member. Therefore, it is possible to increase the dimension of the static movable electrode plates and the static fixed electrode plates. Therefore, it is possible to increase the electrostatic force of the static actuator when the static actuator is operated. In addition, the MEMS switch in this invention comprises the static actuator which is independent from the piezoelectric actuators. Therefore, it is possible for the piezoelectric actuator to perform the motion which is different from the motion of the static actuator. Therefore, it is possible to obtain the MEMS switch having a high degree of freedom of the motion.

It is preferred that the static actuator has a dimension which is larger than a dimension of upper surfaces of the piezoelectric elements.

In this case, it is possible to increase the electrostatic force when the static actuator is operated. Therefore, this configuration makes it possible to increase the contact force of the static actuator.

It is preferred that the piezoelectric actuators are configured to have identical structures of being attached to the strips, respectively.

It is preferred that each the fixed contact is electrically insulated from the electrodes of the piezoelectric actuator.

In this case, it is possible to prevent the noise, from the first electrode and the second electrode of the piezoelectric actuator, from being superimposed on the signal which is transmitted through the signal wires It is preferred that each the fixed contact is electrically insulated from the static movable electrode plate of the static actuator. Each the fixed contact is electrically insulated from the static fixed electrode plate of the static actuator.

In this case, it is possible to prevent the noise, from the static movable electrode plate and the static fixed electrode plate of the static actuator, from being superimposed on the signal which is transmitted through the signal wires.

It is preferred that the MEMS switch further comprises a ground electrode. The piezoelectric actuators and the static actuator share the ground electrode.

In this case, it is possible to easily control both the piezoelectric actuators and the static actuators.

It is preferred that the piezoelectric layer is made of a lead-based piezoelectric material.

The lead-based piezoelectric material has a large piezoelectric constant, compared with the AlN and ZnO. Therefore, it is possible to increase the contact force of the movable contact with respect to the fixed contacts.

It is preferred that the movable plate further comprises a movable contact holding portion and coupling portions. The movable contacts is disposed on the movable contact holding portion. The movable contact holding portion is located between the movable electrode holding portions. The movable contact holding portion is coupled to the movable electrode holding portions via the coupling portions. Each the coupling portions has a width which is smaller than widths of the movable contact holding portions. Each the coupling portions has the width which is smaller than widths of said movable electrode holding portion.

In this case, the coupling portion has a width which is shorter than the width of the movable contact holding portion. The coupling portion has the width which is shorter than the width of each one of the movable electrode holding portions. Consequently, the coupling portion is easily flexed, compared with the movable contact holding portion and the movable electrode holding portions. When the coupling portion is flexed, the coupling portion develops the elastic force. The elastic force is applied to the movable contact when the movable contact comes into contact with the fixed contacts. Therefore, it is possible to ensure the contact of the movable contact with respect to the fixed contact.

It is preferred that the movable plate has a cutout which is shaped to expose a portion other than the fixed contacts, whereby the portion other than the fixed contacts being exposed to an upper direction.

In this case it is possible to prevent the capacitance coupling between the static movable electrode plates and the signal wires. Therefore, it is possible to improve the isolation property.

It is preferred that both the signal wires and the static fixed electrode plates are disposed on the substrate. Each one of the signal wires is disposed on the same plane of said substrate. The signal wires have thickness which is equal to each other.

In this case, it is possible to reduce the transmission loss of the high frequency signal.

It is preferred that the MEMS switch further comprises a cover. The cover is provided at its lower surface with a recess. The cover is cooperative with the to incorporate the movable plate between the substrate and the cover. The signal wires and said static fixed electrode plates are disposed on an inside surface of said cover.

In this case, the signal which is transmitted through the signal wires is free from the superimposition of the noise caused from the first electrode and the second electrode of the piezoelectric actuator.

The MEMS switch is manufactured by a fixed electrode forming step, a signal wires forming step, a sacrifice layer forming step, a movable electrode forming step, a movable contact forming step, a movable plate forming step, a first electrode forming step, a piezoelectric layer forming step, a second electrode forming step, and a sacrifice layer removing step. The fixed electrode forming step includes forming the static fixed electrode plate on said upper surface of said substrate. The signal wires forming step includes forming a pair of the signal wires on the upper surface of the substrate. The signal wires are provided with the fixed contacts. The signal wire forming step is performed subsequent to the fixed electrode forming step. The sacrifice layer forming step includes forming a sacrifice layer on the upper surface of the substrate. The sacrifice layer is used for forming the movable plate. The sacrifice layer forming step is performed subsequent to the sacrifice layer forming step. The movable electrode forming step includes forming the static movable electrode plate on the upper surface of the substrate. The movable electrode forming step is performed subsequent to the sacrifice layer forming step. The movable contact forming step includes forming the movable contact. The movable contact forming step is performed subsequent to the movable electrode forming step. The movable plate forming step includes forming the movable plate. The movable plate forming step is performed subsequent to the movable contact forming step. The first electrode forming step includes forming the first electrode of the piezoelectric actuator. The first electrode forming step is performed subsequent to the movable plate forming step. The piezoelectric layer forming step includes forming the piezoelectric layer. The piezoelectric layer forming step is performed subsequent to the first electrode forming step. The second electrode forming step includes forming the second electrode of the piezoelectric actuator. The second electrode forming step is performed subsequent to the piezoelectric layer forming step. The sacrifice layer removing step includes removing said sacrifice layer.

In this case, it is possible to reduce the parasitic capacitance between the movable contact and the fixed contacts. In addition, it is possible to obtain the MEMS switch comprising the piezoelectric actuators and the static actuators being configured to develop the desired contact force by the low consumption of the electrical power.

In contrast, the above MEMS switch is manufactured by a sacrifice layer forming step, a movable plate forming step, a first electrode forming step, a piezoelectric layer forming step, a second electrode forming step, a movable contact forming step, a sacrifice layer removing step, and a bonding step. The sacrifice layer forming step includes forming a sacrifice layer on an upper surface side of said substrate. The sacrifice layer is used for forming said movable plate. The movable plate forming step includes forming the movable plate on the upper surface side of the substrate. The movable plate forming step is performed subsequent to the sacrifice layer forming step. The first electrode forming step includes forming the static movable electrode plate and the first electrode of the piezoelectric actuator. The first electrode forming step is performed subsequent to the movable plate forming step. The piezoelectric layer forming step includes forming the piezoelectric layer. The piezoelectric layer forming step is performed subsequent to the first electrode forming step. The second electrode forming step includes forming the second electrode of the piezoelectric actuator. The second electrode forming step is performed subsequent to the piezoelectric layer forming step. The movable contact forming step includes forming a movable contact on the movable plate. The movable contact forming step is performed subsequent to the second electrode forming step. The sacrifice layer removing step includes removing the sacrifice layer. The sacrifice layer removing step is performed subsequent to the movable contact forming step. The bonding step includes bonding the cover to the upper surface of the substrate. The cover is provided with the static fixed electrode plate and a pair of the signal wires with the fixed contact. The coupling step is performed subsequent to the sacrifice layer removing step.

In this case, it is possible to reduce the parasitic capacitance between the movable contact and the fixed contacts. In addition, it is possible to obtain the MEMS switch comprising the piezoelectric actuators and the static actuators being configured to develop the desired contact force by the low consumption of the electrical power. Furthermore, the forming the movable contact is performed subsequent to the forming the piezoelectric actuator on the first surface of the substrate. Therefore, it is possible to freely select the material of the movable contact regardless of the deposition temperature of the piezoelectric layer of the piezoelectric actuator. Therefore, it is possible to have a high degree of the freedom of the material of the movable contact.

BRIEF EXPLANATION OF THE DRAWINGS

FIG. 8A to FIG. 8D show schematic side cross sectional views for explain a main step of manufacturing the MEMS switch.

BEST MODE FOR CARRYING OUT THE INVENTION

First Embodiment

Figures 1A, 1B:
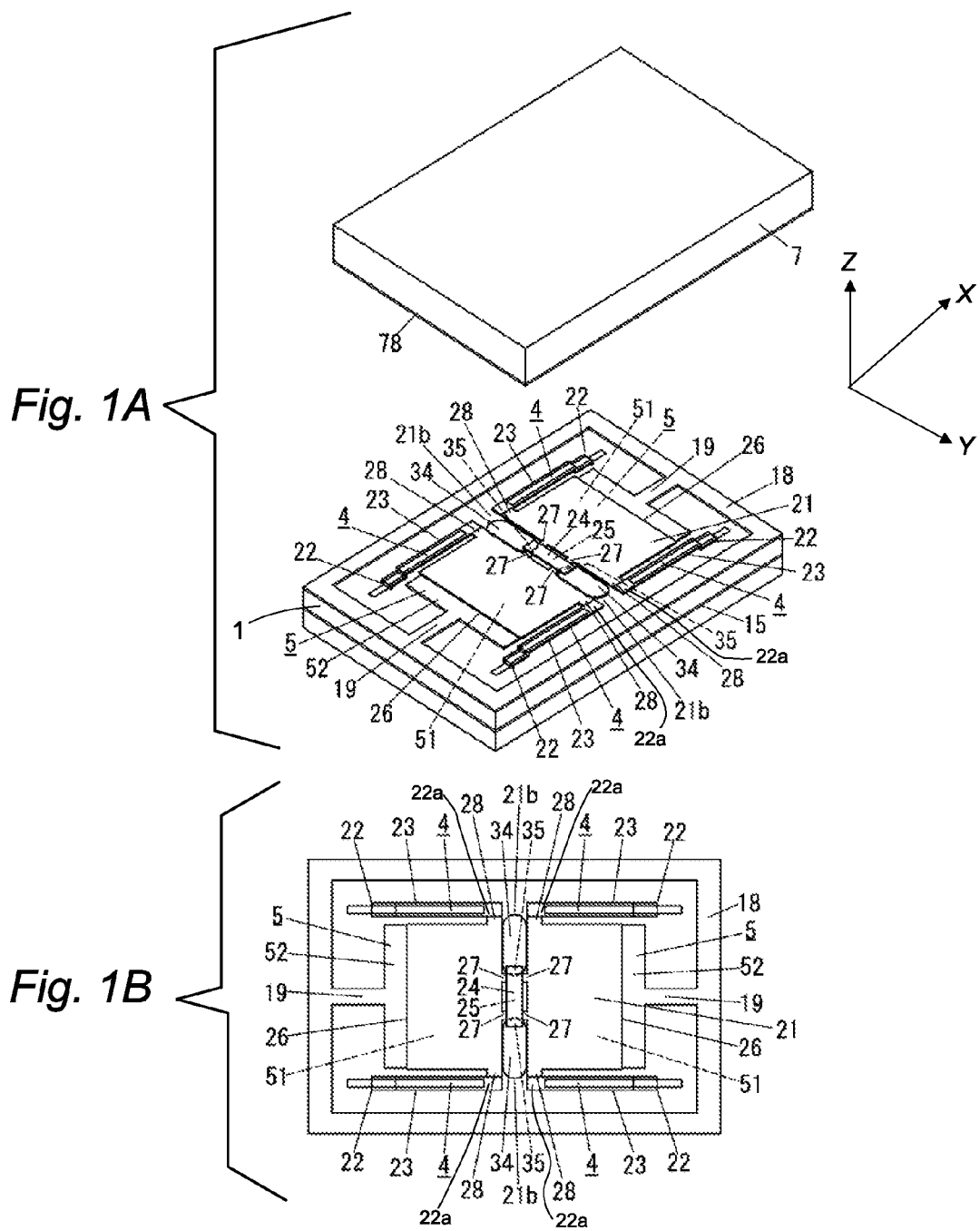
FIG. 1A shows a schematic exploded perspective view of a MEMS switch in the first embodiment.
FIG. 1B shows a top view of the MEMS switch without a cover.
Figure 2:
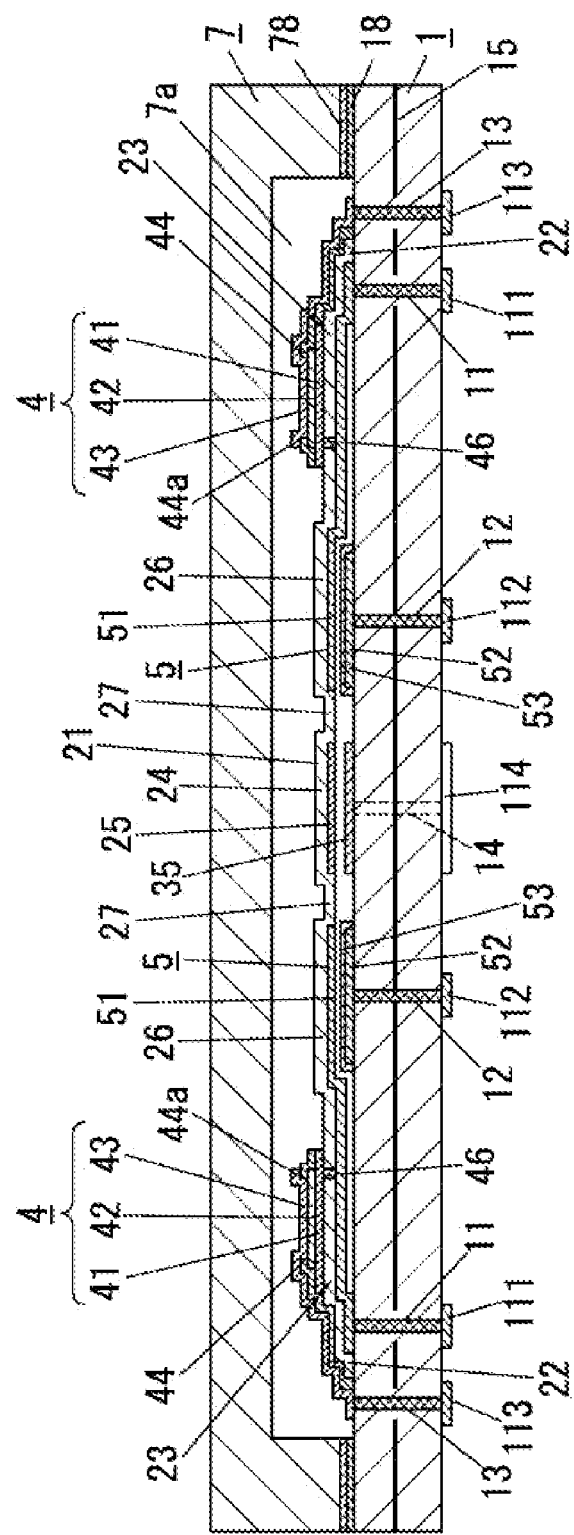
FIG. 2 shows a schematic side cross sectional view taken along the line of X-X shown in FIG. 9.

Hereinafter a MEMS switch in this embodiment is explained with FIG. 1 and FIG. 2. In FIG. 1, X direction indicates the lengthwise direction of the substrate and the movable plate. X direction indicates the left side of the MEMS switch. Y direction indicates the width direction of the substrate and the movable plate. Y direction indicates the front direction of the MEMS switch. Z direction indicates the thickness direction of the substrate and the movable plate. The Z direction indicates the upper direction of the MEMS switch.

FIG. 1 shows a MEMS switch in this embodiment. As shown in FIG. 1, the MEMS switch comprises a substrate 1, four strips 23, a movable plate 21, a pair of signal wires 34, 34, and a cover 7. The substrate 1 is shaped to have a rectangular plate shape, whereby the substrate 1 has a length, a width, and a thickness. Each one of the strips 23 is fixed on the upper surface of the substrate 1. The movable plate 21 is supported to the substrate 1 via the strips 23, whereby the movable plate 21 is disposed in an upside of the substrate. The movable plate 21 is disposed in an upside of the substrate to be movable along the thickness direction of the substrate. The movable plate 21 is provided with movable contact 25. A pair of the signal wires 34, 34 is disposed on the upper surface of the substrate 1. The signal wires 34, 34 are provided with fixed contacts 35, 35, respectively. The fixed contacts 35, 35 are spaced from the movable contact 25 by a predetermined space. The fixed contacts 35, 35 are disposed to come into contact with the movable contact 25 when the movable plate 21 is moved along the thickness direction of the substrate 1. That is, the movable contact 25 corresponds to the fixed contact 35. The cover 7 is coupled to the substrate 1 to keep a space between the cover 7 and the substrate 1 hermetically, whereby the cover 7 is cooperative with the substrate 1 to incorporate the movable plate 2.

The MEMS switch in this embodiment comprises a piezoelectric actuator 4 and a static actuator 5. The piezoelectric actuator 4 and the static actuator 5 is configured to move the movable contact 25 along the thickness direction of the substrate 1, whereby the movable contact 25 moves toward the fixed contacts 35, 35. The piezoelectric actuators 4 are disposed on the strips 23, respectively. Each one of the piezoelectric actuators 4 comprises a piezoelectric layer 42, a first electrode, and a second electrode. The piezoelectric layer 42 has a first surface and a second surface which is opposite of the first surface. The first electrode is disposed on the first surface of the piezoelectric layer 42. The second electrode is disposed on the second surface of the piezoelectric layer 42. The first electrode is disposed on the lower surface of the piezoelectric layer. The second electrode is disposed on the upper surface of the piezoelectric layer. The piezoelectric actuator 4 is configured to develop a stress when the voltage is applied between the first electrode and the second electrode. When the stress is developed by the piezoelectric actuator 4, the movable contact 25 is moved toward the fixed contacts 35, 35. Consequently, the strips 23 are deformed. The static actuator comprises a static fixed electrode plate 52 and a static movable electrode plate 51. The static movable electrode plate 51 is disposed on the movable plate 21. The static fixed electrode plate 52 is disposed such that the static fixed electrode plate 52 is spaced from the static movable electrode plate 51 by a predetermined distance. That is, the static fixed electrode plate 52 is disposed in an opposed relation to the static movable electrode plate 51. The static movable electrode plate is configured to come into contact with the static fixed electrode plate 52 when the voltage is applied between the static movable electrode plate 51 and the static fixed electrode plate 52.

The substrate 1 is made of material of ceramic. The substrate 1 is provided at its upper surface with the signal wires 34, 34. The substrate 1 is provided at its upper surface with the static fixed electrode plate 52. The static fixed electrode plate 52 in this embodiment also acts as a ground electrode. It should be noted that the material of the substrate 1 is not limited to the ceramic. That is, a glass substrate, a SOI substrate, and a silicon substrate are also used as the substrate 1. It is preferred to employ the substrate made of a material having a high dielectric constant.

The substrate 1 is provided at its center of the upper surface with a pair of the signal wires 34, 34. The signal wires 34, 34 are arranged in the same straight line which extends in parallel with the width direction of the substrate 1. The fixed contacts 35, 35 are made of metal material which is same as a metal material of the signal wires 34, 34. The fixed contacts 35, 35 have thicknesses which is equal to thicknesses of the signal wires 34, 34. In this embodiment, the fixed contacts 35, 35 are integrally formed with the signal wires 34, 34.

In this embodiment, the fixed contacts 35, 35 and the signal wires 34, 34 are made of Au. However, the material of the fixed contacts 35 and the signal wires 34, 34 are not limited to Au. One of the materials selected from Au, Ni, Cu, Pd, Rh, Ru, Pt, Ir, and Os is capable of being used as the material of the fixed contacts 35, 35 and the signal wires 34, 34. In addition, an alloy which is made of two or more materials selected from Au, Ni, Cu, Pd, Rh, Ru, Pt, Ir, and Os is capable of being used as the material of the fixed contacts 35, 35 and the signal wires 34, 34.

The piezoelectric layer 42 of the piezoelectric actuator 4 is made of PZT (PZT is equal to $PbTi_{0.48}Zr_{0.52}O_3$.) Each one of the first electrodes 41 which is disposed between each one of the piezoelectric layers 42 and each one of the strips 23 is made of Pt. Each one of the second electrodes 42 which is disposed on the upper surface 42 of the piezoelectric layer 42 is made of Au. However, the materials of the piezoelectric layer 42, the first electrode 42, and the second electrode 43 are not limited thereto. Each one of the piezoelectric layers is provided at is upper surface with an electrically insulation film 44. Each one of the piezoelectric layers is provided with an aperture 44a. Each one of the apertures 44a defines a contact area between the upper electrode 43 and the piezoelectric layer 42. The electrically insulation film 44 is provided for reinforcing the strip 23 which supports the piezoelectric actuator 4. The electrically insulation film 44 extends from the upper surface of the piezoelectric layer 42 to the upper surface of the substrate 1. The electrically insulation film 44 is a silicon dioxide film. However, the material of the electrically insulation film 44 is not limited to the silicon dioxide film. A stacked film comprising a silicon dioxide film and a silicon nitride film on the silicon dioxide film is capable of being used as the electrically insulation film 44.

The piezoelectric material of the piezoelectric layer 42 is not limited to PZT. PZT with impurity is capable of being used as the piezoelectric material of the piezoelectric layer 42. PMN-PZT is capable of being used as the piezoelectric material of the piezoelectric layer 42. In addition, lead free piezoelectric material is also capable of use as the material of the piezoelectric layer 42. The lead free piezoelectric material is exemplified by KNN($K_{0.5}Na_{0.5}NbO_3$), KN($KNBO_3$), NN($NaNbO_3$), and KNN with impurity such as Li, Nb, Ta, Sb, Cu. The above explained lead-based piezoelectric material and lead free piezoelectric material such as KNN, KN, and NN have high piezoelectric properties which is greater than piezoelectric properties of AlN and ZnO. Therefore, it is possible to use the lead-based piezoelectric material, KNN, KN, and NN as the piezoelectric material of the piezoelectric layer 42. Consequently, it is possible to increase the contact pressure of the static movable electrode plate with respect to the static fixed electrode plate. In addition, it is possible to obtain the MEMS switch which responds to an environment issues by using the KNN, KN, and NN as the material of the piezoelectric layer 42. The piezoelectric actuator 4 in this embodiment is realized by a unimorph type piezoelectric actuator. However, it is possible to employ the piezoelectric actuator 4 of the bimorph type as the piezoelectric actuator in this embodiment.

In contrast, the static actuator 5 comprises a static movable electrode plate 51 and a static fixed electrode plate 52. The movable plate 21 is provided at its both lengthwise ends with movable electrode holding portions 26. The static movable electrode plates 51 are disposed on the movable electrode holding portions 26, respectively. The static fixed electrode plates 52 are disposed in an opposed relation to the static movable electrode plates 51, respectively. When the voltage is applied between the static movable electrode plate 51 and the static fixed electrode plate 52, the electrostatic force is developed between the static movable electrode plate 51 and the static fixed electrode plate 52. The electrostatic force moves the static movable electrode plate 51 along a thickness direction of the substrate 1 such that the static movable electrode plate 51 comes into contact with the static fixed electrode plate 52. The static movable electrode plate 51 extends from the strip 23 to the upper surface of the substrate 1, whereby the static movable electrode plate 51 also reinforces the strip 23. In addition, the static movable electrode plate 51 is electrically connected to the lower electrode 41 of the piezoelectric actuator 4 via a via-electrode 46. The via-electrode extends along the thickness direction of the strip 23, and penetrates through the strip 23. The static fixed electrode plate 52 is provided at its upper surface with an electrically insulation film 53. The electrically insulation film 53 is provided for prevention of the sticking of the static fixed electrode plate 52 with respect to the static movable electrode plate 51. (Sticking the static fixed electrode plate with respect to the static movable electrode plate 51 is, so called, a sticking.) The static fixed electrode plate 52 is made of Au. The static movable electrode plate 51 is made of Pt. However, the material of the static fixed electrode plate 52 is not limited to Au. Similarly, the material of the static movable electrode plate 51 is not limited to Pt. In addition, the electrically insulation film 53 is made of silicon dioxide. However, the silicon nitride is also capable of using as the material of the electrically insulation film 53.

The substrate 1 is provided with wirings 14, 12, 11, 13. The wiring 14 is electrically coupled to each the signal wire 34. The wiring 12 is electrically coupled to the static fixed electrode plate 52. The wiring 11 is electrically coupled to the static movable electrode plate 51. The wiring 13 is electrically coupled to the second electrode 43. Each one of the wirings 14, 12, 11, 13 extends along the thickness direction of the substrate 1 to penetrate through the substrate 1. The substrate 1 is provided with electrodes 114, 112, 111, 113. Each one of the electrodes 114, 112, 111, 113 is provided for establishing the electrical connection with respect to the outside. The electrode 114 is electrically coupled to the wiring 14. The electrode 112 is electrically coupled to the wiring 12. The electrode 111 is electrically coupled to the wiring 11. The electrode 113 is electrically coupled to the wiring 13. In this embodiment, the first electrode 41 is electrically coupled to the static movable electrode plate 51 of the static actuator 5 via a via-electrode 46. However, it is preferred to dispose the first electrode 41 on the upper surface of the substrate 1 in order to establish the electrical connection between the first electrode 41 and electrodes 114, 112, 111, 113 through the static movable electrode plate and the other wirings. The wirings 14, 12, 11, 13 are made of Au. However, materials such as Cu and Ni are also capable of using as the material of the wirings 14, 12, 11, 13. In addition, the electrodes 114, 112, 111, 113 are made of Au. However, materials such as Cu, Cr, and Pt are capable of using as the material of the electrodes 114, 112, 111, 113.

In addition, the substrate 1 is provided with a ground electrode 15. The ground electrode 15 has a predetermined pattern. The ground electrode 15 is buried in the substrate 1. The static fixed electrode plate 52, which also acts as a ground electrode, is electrically coupled to the ground electrode 15 through the wiring 12. The signal wires 34 are electrically coupled to the electrode 114 through the wiring 14.

The movable plate 21 comprises a movable contact holding portion 24 and a coupling portion 27. The movable contact holding portion 24 is provided for placing the movable contact 25. The movable contact holding portion 24 is located at a longitudinal center of the movable plate 21. The coupling portion 27 is configured to couple the movable contact holding portion 24 with the movable electrode holding portion 26. The coupling portion 27 has a width which is shorter than a width of the movable contact holding portion 24. The coupling portion 27 has the width which is shorter than a width of the movable electrode holding portion 26. The movable plate 21 and the strip 23 are made of undoped polysilicon. However, the material of the movable plate 21 and the strip 23 is not limited to the undoped polysilicon. It is possible to use the material such as $Si_3N_4$ and $SiO_2$ as the material of the movable plate 21 and the strip 23.

The above movable plate 21 has a length and width, similar to the substrate 1. The movable plate 21 is provided at its longitudinal center with a movable contact. The movable plate 21 is provided at its both longitudinal ends with a movable electrode holding portion 26. Each one of the strips 23 has flexibility. The strips are disposed at a portion which is located at an outside portion of both width ends of the movable plate. The strips are disposed at the portion which is located at an outside portion of the movable electrode holding portion. Therefore, the MEMS switch comprises four strips 23. The strips 23 are arranged along the longitudinal direction of the substrate 1. The strips 23 are arranged along the longitudinal direction of the movable plate 21. Each one of the strips 23 has a first end 22a and a second end 22. The first end of each the strip 23 is located at a longitudinal center of the substrate 1. The second end 22 is located at a portion opposite to the first end 22a located at a longitudinal center of the substrate 1. The second end 22 of each the strip 23 is fixed to the substrate 1. The first end 22a of each the strip 23 is coupled to the movable plate 21 through a coupling plate 28. The piezoelectric actuator 4 is disposed on the upper surface of the strip 23, whereby the piezoelectric actuator 4 is located at a portion outside of the movable plate 21 in the width direction of the movable plate 21. Therefore, the piezoelectric element of the piezoelectric actuator 4 is configured to develop the stress so as to deform each the strip 23 having the flexibility. That is, each the piezoelectric element of the piezoelectric actuator 4 is configured to deform each the strip 23 such that the stress is applied to the coupling plate 28. Each the piezoelectric actuator 4 is attached to each the strip 23 such that piezoelectric actuators 4 have identical structures of being attached to the strip, respectively. In addition, the static actuator has a dimension which is larger than a dimension of the upper surface of the piezoelectric actuator. The movable plate 21 is formed with cutouts 21b, 21b. The cutouts 21b, 21b are provided for uncovering a portion of the signal wires 34, 34 other than the fixed contacts 35, 35.

The cover 7 is shaped to have a rectangular plate shape. The cover 7 is made from the electrically insulation substrate. The cover 7 is provided at its lower surface with a recess 7a. The cover 7 is shaped to have a rim. The cover 7 is cooperative with a substrate 1 to incorporate the movable plate 21. The space which is formed by the substrate 1 and the cover 7 is hermetically sealed. Because the cover 7 is jointed to the substrate 1 hermetically, it is possible to prevent the foreign matter from being irrupted between the movable contact 51 and the fixed contacts 35, 35. That is to say, this configuration makes it possible to ensure the contact of the movable contact 51 to the fixed contacts 35, 35.

The substrate 1 is provided at its entire outer circumference of the upper surface with a first bonding metal layer 18. The cover 7 is provided at its entire circumference of the lower surface with a second bonding metal layer 78. The second bonding metal layer 78 is coupled to the first bonding metal layer 18, whereby the cover 7 and the substrate 1 are joined together. The first bonding metal layer 18 and the second bonding metal layer 78 are made of Au. The substrate 1 is provided at its upper surface with a metal layer 19. The metal layer 19 is continuously formed from the static fixed electrode plate 52 and the first bonding metal layer 18. The metal layer 19 is provided for establishing the electrical connection of the static fixed electrode plate 52 to the first bonding metal layer 18.

The cover 7 is coupled to the substrate 1 by a room temperature bonding method. The room temperature bonding method comprises a first step, a second step, and a third step. The first step includes a cleaning step and an activation step. The cleaning step includes irradiating argon plasma, ion beam, and atom beam to the surface of the first bonding metal layer and the second bonding metal layer in vacuum. The activation step includes activating the surface of the first bonding metal layer and the second bonding metal layer. The second step includes contacting the surface of the first bonding metal layer to the surface of the second bonding metal layer. The third step includes directly jointing the first bonding metal layer and the second bonding metal layer under a room temperature. However, the bonding method of the cover 7 to the substrate 1 is not limited to the room temperature bonding method. That is to say, it is possible to bond the cover 7 to the substrate 1 by an eutectic material having a low melting point such as AuSn and the solder. In addition, it is possible to bond the cover 7 to the substrate 1 by the anodic bonding method.

In a case where the MEMS switch of the above is mounted on the mounting substrate such as the printed substrate, the electrodes 111 to 113, on the lower surface of the substrate 1, are electrically connected to the patterned wirings, formed on the mounting substrate through bumps, respectively.

Hereinafter, the method of manufacturing the MEMS switch in this embodiment is explained with attached FIG. 3A to FIG. 3F and FIG. 4A to FIG. 4F.

Figure 3A:
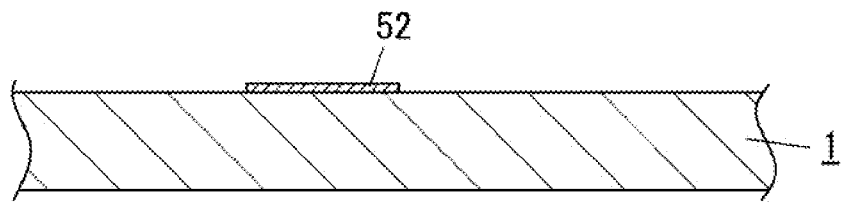
FIG. 3A to 3F show schematic side cross sectional views for explaining a main step of manufacturing the MEMS switch.

First, preparing the substrate 1 with the ground electrode 15, the wirings 11 to 14, and the electrodes 111 to 114 is performed. Subsequently, the fixed electrode forming step is performed. The fixed electrode forming step includes forming the static fixed electrode plate 52 on the upper surface of the substrate 1, whereby the substrate 1 having the structure shown in FIG. 3A is prepared. Specifically, the fixed electrode forming step comprises a metal layer forming step and a patterning step. The metal layer forming step includes forming the metal layer on the upper surface of the substrate 1. A part of the metal layer on the upper surface of the substrate 1 acts as the static fixed electrode plate 52. Specifically, in the fixed electrode forming step, first, the metal layer is prepared on the upper surface of the substrate 1 by a method such as sputtering method and vapor deposition method. Subsequently, the metal layer is patterned by a photolithography technique and an etching technique, whereby the static fixed electrode plate 52, a first bonding metal layer 18, and the metal layer 19 are formed on the upper surface of the substrate 1.

Figure 3B:
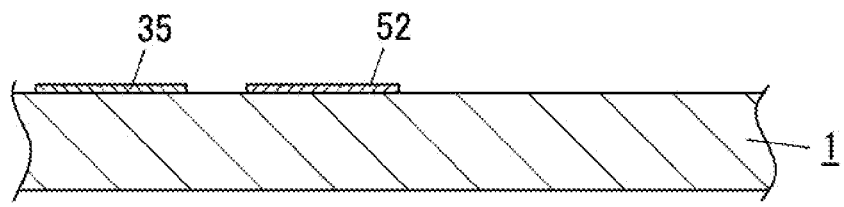

Subsequent to the fixed electrode forming step, the signal wire forming step is performed. The signal wire forming step includes forming a pair of the signal wires 34, 34 having the fixed contacts 35, 35, respectively. Consequently, the structure shown in FIG. 3B is prepared. Specifically, the signal wire forming step includes a resist film forming step, a plating step, and a liftoff step. The resist film forming step includes forming a patterned resist film on the upper surface of the substrate 1. The patterned resist film is formed to have an opening for exposing a region for forming the signal wires 34. Subsequently, the plating step of plating the signal wires 34, 34 by a nonelectrolytic plating method is performed, whereby the signal wires 34, 34 are formed on the upper surface of the substrate 1. Subsequently, the liftoff step of removing the resist film and the plating film on the resist film is performed.

Figure 3C:
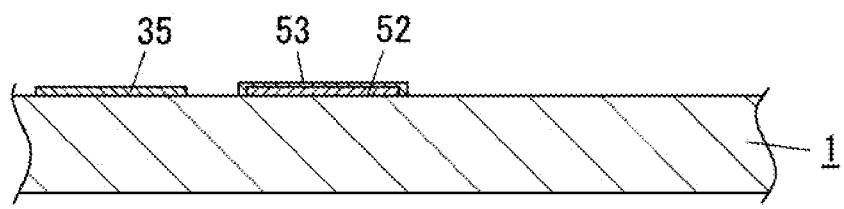

Subsequent to the signal wire forming step, the electrically insulation layer forming step is performed. In the electrically insulation layer forming step, the electrically insulation film 53 is formed on the upper surface of the substrate such that the electrically insulation film 53 covers the static fixed electrode plate 52. Consequently, the structure shown in FIG. 3C is obtained. In the electrically insulation film forming step, first, the electrically insulation film forming step of forming the electrically insulation film on an entire upper surface of the substrate 1 by methods such as the sputtering method and the CVD method is performed. A part of the electrically insulation film on the upper surface of the substrate acts as the electrically insulation film 53. Subsequently, the patterning step of patterning the electrically insulation film by the photolithography technique and the etching technique is performed, whereby the electrically insulation film 53 is formed.

Figure 3D:
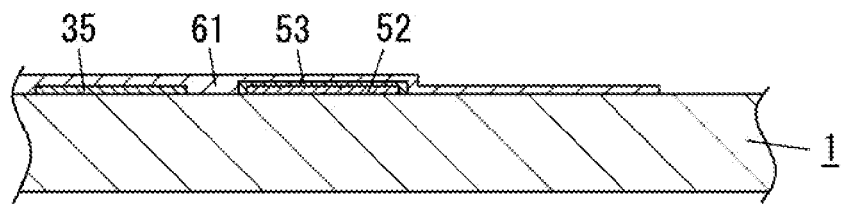

Subsequent to the electrically insulation film forming step, a sacrifice layer forming step is performed. In the sacrifice layer, the sacrifice layer 61 is formed on an entire upper surface of the substrate 1. Consequently, the structure shown in FIG. 3D is prepared. The sacrifice layer 61 is provided for forming the movable plate 21 and the strips 23. The sacrifice layer 61 is made of polyimide.

Figure 3E:
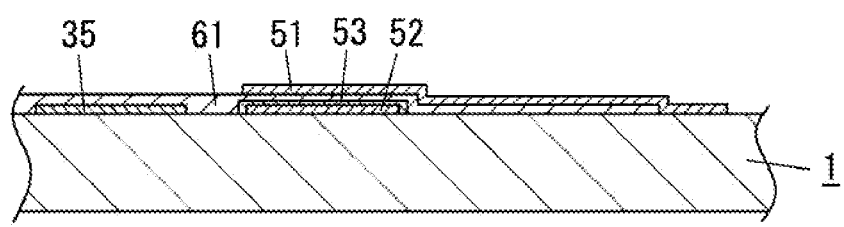

Subsequent to the sacrifice layer forming step, the movable electrode forming step is performed. In the movable electrode forming step, the static movable electrode plate 51 is formed on the upper surface of the substrate 1. Consequently, the structure shown in FIG. 3E is prepared. In the movable electrode forming step, first, a resist film forming step of forming a resist film on the upper surface of the substrate 1 is performed. The resist film is provided with a pattern for exposing a region for forming the static movable electrode plate 51. Subsequently, the step of forming the static movable electrode plate 51 on the upper surface of the substrate 1 by the nonelectrolytic plating method is performed. Subsequently, the liftoff step of removing the resist film and the plating film on the resist film is performed.

Figure 3F:
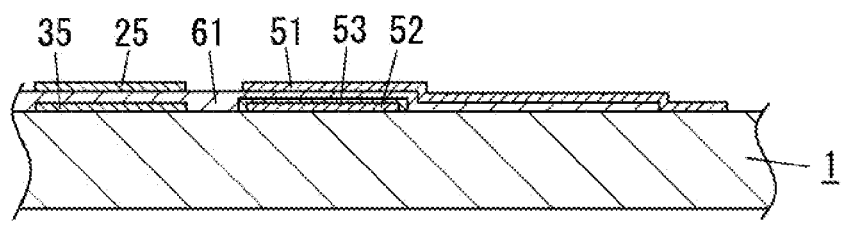

Subsequent to the movable electrode forming step, the movable contact forming step is performed. In the movable contact forming step, the movable contact 25 is formed. Consequently, the structure shown in FIG. 3F is prepared. In the movable contact forming step, the resist film forming step of forming a patterned resist film on the first surface of the substrate 1 is performed. The patterned resist film has a pattern for exposing a region for forming the movable contact 25. Subsequently, the step of forming the movable contact 25 on the first surface of the substrate 1 by the nonelectrolytic plating method is performed. Subsequent to the step of forming the movable contact 25, the liftoff step of removing the resist film and the plating film on the resist film is performed.

Figure 4A:
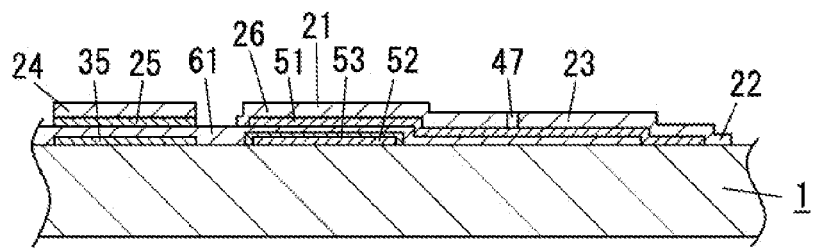
FIG. 4A to 4F show schematic side cross sectional views for explaining a main step of manufacturing the MEMS switch.

Subsequent to the movable contact forming step, the movable plate forming step is performed. In the movable plate forming step, the movable plate 21 and the strips 23 are formed. Consequently, the structure shown in FIG. 4A is prepared. In the movable plate forming step, a step of forming a undoped polysilicon layer on the entire upper surface of the substrate 1 by the CVD method is performed. A part of the undoped polysilicon layer acts as the movable plate. Subsequent to the step of forming a undoped polysilicon layer, a step of patterning the polysilicon layer by the photolithography technique and the etching technique is performed. Consequently, the movable plate 21, the strips 23, and via hole 6 for forming a via electrode 46 is prepared.

Figure 4B:
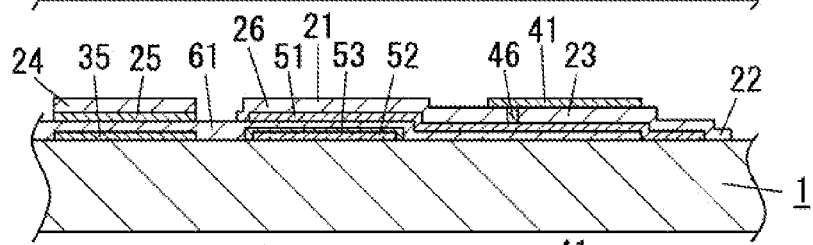

Subsequent to the movable plate forming step, the first electrode forming step of forming the first electrode 41 is performed. Consequently, the structure shown in FIG. 4B is prepared. In the first electrode forming step, the step of forming the metal layer (such as Pt layer) on the upper surface of the substrate 1 by the method such as the sputtering method is performed. A part of the metal layer acts as the first electrode 41. Subsequently to the step of forming the metal layer, the patterning step of patterning the metal layer by the photolithography technique and the etching technique is performed. Consequently, the first electrode 41 and the via electrode 46 are formed.

Figure 4C:
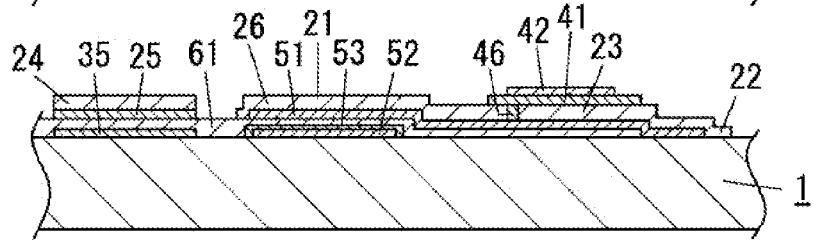

Subsequent to the first electrode forming step, the piezoelectric layer forming step is performed. In the piezoelectric layer forming step, the piezoelectric layer 42 is formed. Consequently, the structure shown in FIG. 4C is prepared. In the piezoelectric layer forming step, first, the step of forming the piezoelectric layer (such as PZT layer) by the method such as the sputtering method and the CVD method is performed. Subsequent to the step of forming the piezoelectric layer, the patterning layer of patterning the piezoelectric layer by the photolithography technique and the etching technique is performed. Consequently, the piezoelectric layer 42 is formed.

Figure 4D:
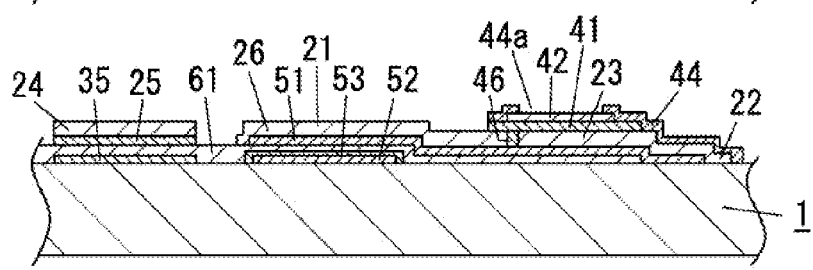

Subsequent to the piezoelectric layer forming step, the electrically insulation layer forming step is performed. In the electrically insulation layer forming step, the electrically insulation layer 44 having an opening 44a which defines the contact area between the piezoelectric layer 42 and the second electrode is formed. Consequently, the structure shown in FIG. 4D is prepared. In the electrically insulation layer forming step, first, a step of forming a patterned resist film on the upper side of the substrate 1 is performed. The patterned resist film has a pattern for exposing a region for forming the electrically insulation film 44. Subsequent to the step of forming the patterned resist film, the step of forming the electrically insulation film 44 on the upper surface of the substrate 1 by the CVD method is performed. Subsequent to the step of forming the electrically insulation film 44, the liftoff step of removing the resist film and the electrically insulation film on the resist layer is performed.

Figure 4E:
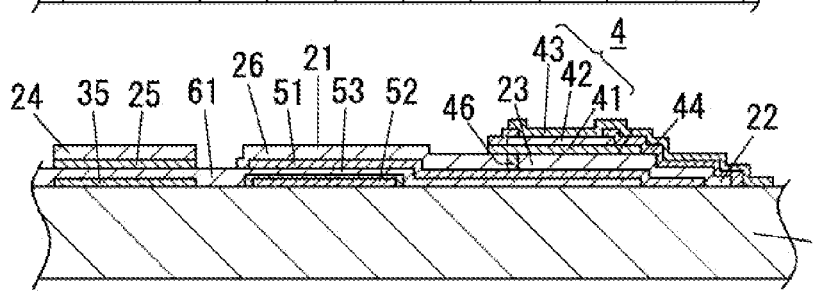
Figure 4F:
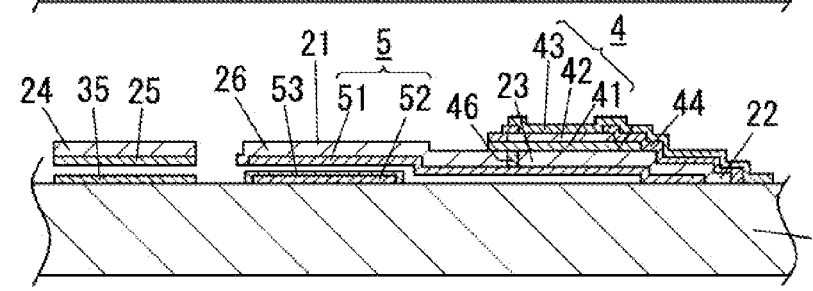

Subsequent to the electrically insulation film forming step, the second electrode forming step is performed. In the second electrode forming step, the second electrode 43 is formed. Consequently, the structure shown in FIG. 4E is prepared. In the second electrode forming step, first, the step of forming the metal layer (such as Au) on an entire upper surface side of the substrate 1 by the vapor deposition is performed. Subsequent to the step of forming the metal layer, the step of patterning the metal layer by the photolithography technique and the etching technique is performed. Consequently, the second electrode 43 is formed. It is noted that the manufacturing method in this embodiment includes a piezoelectric actuator forming step which comprises the first electrode forming step of forming the first electrode 41, the piezoelectric layer forming step of forming the piezoelectric layer 42, and the second electrode forming step of forming the second electrode 43 in series.

Subsequent to the second electrode forming step, the sacrifice layer removing step is performed. In the sacrifice layer removing step, the sacrifice layer 61 is selectively removed. Consequently, a gap formed between the movable contact 25 and each the fixed contact 35 such that a movable contact 25 is spaced from each the fixed contact 35 by a first distance, shown in FIG. 4F. In addition, a gap is formed between the static movable electrode plate 51 and the electrically insulation film 53 such that the static movable electrode plate 51 is spaced from the electrically insulation film 53 by a second distance. The first distance and the second distance is determined by the thickness of the sacrifice layer. It is preferred that the first distance is longer than the second distance in order to reduce the parasitic capacitance which is created between the movable contact 25 and each the fixed contact 35.

Subsequent to the sacrifice layer removing step, the bonding step of bonding the substrate 1 with the cover 7 is performed. Consequently, the MEMS switch shown in FIG. 1A, FIG. 1B, and FIG. 2 is obtained.

As mentioned above, the MEMS switch in this embodiment comprises the piezoelectric actuator 4 and the static actuator 5. The piezoelectric actuator 4 and the static actuator 5 are configured to move the movable contact 25 such that the movable contact 25 comes into contact with the fixed contacts 35, 35. Each the piezoelectric actuator 4 is disposed on each the strip 23. The piezoelectric actuator 4 is configured to deform the strip 23 when the voltage is applied between the first electrode 41 and the second electrode which are located at the both surface of the piezoelectric layer 42. Consequently, the movable contact 25 is contacted to the fixed contacts 35, 35. The static actuator 5 comprises a static movable electrode plate 51 and the static fixed electrode plate 52.

The static movable electrode plate 51 is disposed on the movable plate 21. The static fixed electrode plate 52 is disposed such that the static fixed electrode plate 52 faces to the static movable electrode plate 51. The static actuator 5 is configured to move the movable contact 25 when the voltage is applied between the static movable electrode plate 51 and the static fixed electrode plate. Consequently, the movable contact 25 comes into contact with the fixed contacts 35, 35. Therefore, in the MEMS switch in this embodiment, first, the piezoelectric actuator 4 develops the force which moves the movable contact 25 closer to the fixed contact 35, 35. Subsequently, the static actuator 5 develops the electrostatic force which moves the movable contact 25 to the fixed contacts 35, 35. Therefore, it is possible to reduce the parasitic capacitance which is created between the movable contact 25 and each the fixed contact 35 by increasing the first distance. Consequently, the isolation property of the MEMS switch is improved. As a result, it is possible to operate the MEMS switch with low electrical power.

In this manner, the MEMS switch in this embodiment comprises a movable plate 21. The movable plate 21 has the length and width, similar to the substrate 1. The movable plate 21 is provided at it longitudinal center with the movable contact. The movable plate 21 is provided at its both longitudinal ends with the movable electrode holding portions 26. The strips 23 have the flexibility. The strips 23 are arranged at a portion outside of the both width ends of the movable plate. Therefore, the MEMS switch has the four strips 23. The strips 23 extend along the longitudinal direction of the substrate 1 and also the movable plate 21. Each the strip 23 has the first end 22a and the second end 22. Each the first end of the strip 23 is located at the longitudinal center of the substrate. Each the second end of the strip 23 is located at the portion opposite to the first end 22a in the longitudinal center of the substrate 1. Each the second end of the strip 23 is fixed to the substrate 1. Each the first end of the strip 23 is coupled to the movable plate 21 through the coupling plate 28. Each the piezoelectric actuator 4 is disposed on the upper surface of each the strip 23. Consequently, the piezoelectric actuator 4 is located at a portion outside of both the width end of the movable plate 21. The static actuator comprises a pair of the static fixed electrode plate and a pair of the static movable electrode plates. Each the static movable electrode plate is disposed on the movable plate. Therefore, it is possible to reduce the parasitic capacitance. In addition, the MEMS switch in this embodiment comprises the piezoelectric actuator. This configuration makes it possible to contact the movable contact to the fixed contact by the desired pressure with low consumption of the electrical power. Furthermore, the MEMS switch in this embodiment comprises the piezoelectric actuator 4 and the static actuator which is spaced from the piezoelectric actuator 4. Therefore, it is possible to employ the static actuator having the static movable electrode plate 51 and the static fixed electrode plate 52 both of which has the large dimension. Therefore, it is possible to increase the electrostatic force which is developed when the static actuator 5 is operated. Consequently, it is possible to increase the contact force which is applied when the movable contact 25 comes into contact with the fixed contact 35. In addition, the MEMS switch comprises the piezoelectric actuator 4 and the static actuator independently from each other. Therefore, it is possible for the piezoelectric actuator 4 to develop the motion which is different from the motion of the static actuator 5. That is, it is possible to obtain the MEMS switch having a high possibility of the motion of the piezoelectric actuator 4 and the motion of the static actuator 5.

In addition, the MEMS switch in this embodiment comprises the signal wires 34 which are electrically insulated from the first electrode 41 and the second electrode 43 of the piezoelectric actuator. That is to say, the fixed contact 35 is electrically insulated from the first electrode 41 and the second electrode 43 of the piezoelectric actuator. Therefore, it is possible to prevent the noise which is developed by the first electrode 41 and the second electrode 43 from being superimposed on the signal which is transmitted through the signal wires 34, 34. In addition, the signal wires 34, 34 is electrically insulated from the static movable electrode plate 51 and the static fixed electrode plate 52 of the static actuator 5. Therefore, it is possible to prevent the noise which is caused by the static movable electrode plate 51 and the static fixed electrode plate 52 from being superimposed on the signal which is transmitted through the signal wires 34, 34.

In addition, the MEMS switch in this embodiment comprises the static movable electrode 51 of the static actuator which is electrically connected to the lower electrode 41 of the piezoelectric actuator 4. In addition, the static movable electrode plate 51 also has a function of the ground electrode. Consequently, the piezoelectric actuator 4 and the static actuator 5 share the ground electrode. Therefore, it is possible to easily control the piezoelectric actuator and the static actuator 5, respectively.

In addition, the MEMS switch in this embodiment comprises the movable plate 21 which has the coupling portions 27 which couples the movable contact holding portion 24 with the movable electrode holding portion 26. The coupling portion 27 has a width which is shorter than the width of the movable contact holding portion 24 and also which is shorter than the width of the movable electrode holding portion 26. By regulating an amount of the flexibility of the coupling portion 27, it is possible to contact the movable contact 25 to each the fixed contact 35, 35 by the desired pressure. Therefore, it is possible to ensure the contact of the movable contact 25 to each the fixed contact 35, 35.

In addition, the MEMS switch in this embodiment comprises the movable plate 21 which is formed with the cutouts. Each the cutout is shaped for exposing the portion of the signal wires 34, 34 other than the fixed contacts. Consequently, it is possible to prevent the capacitance coupling which is caused by the static movable electrode plate 51 and each the signal wires 34, 34. Therefore, it is possible to obtain the MEMS switch having the high isolation property.

In addition, the MEMS switch in this embodiment comprises the signal wires 34, 34 and the static fixed electrode plate 52 which are disposed on the substrate 1. The signal wires 34 are disposed on the same plane surface of the substrate 1. The signal wires 34 have the thicknesses which is equal to each other. Therefore, it is possible to obtain the MEMS switch having a good impedance matching. In addition, the transmission loss of the high frequency signal is reduced. Therefore, it is possible to obtain the MEMS switch having a good high frequency property.

Second Embodiment

Figure 5:
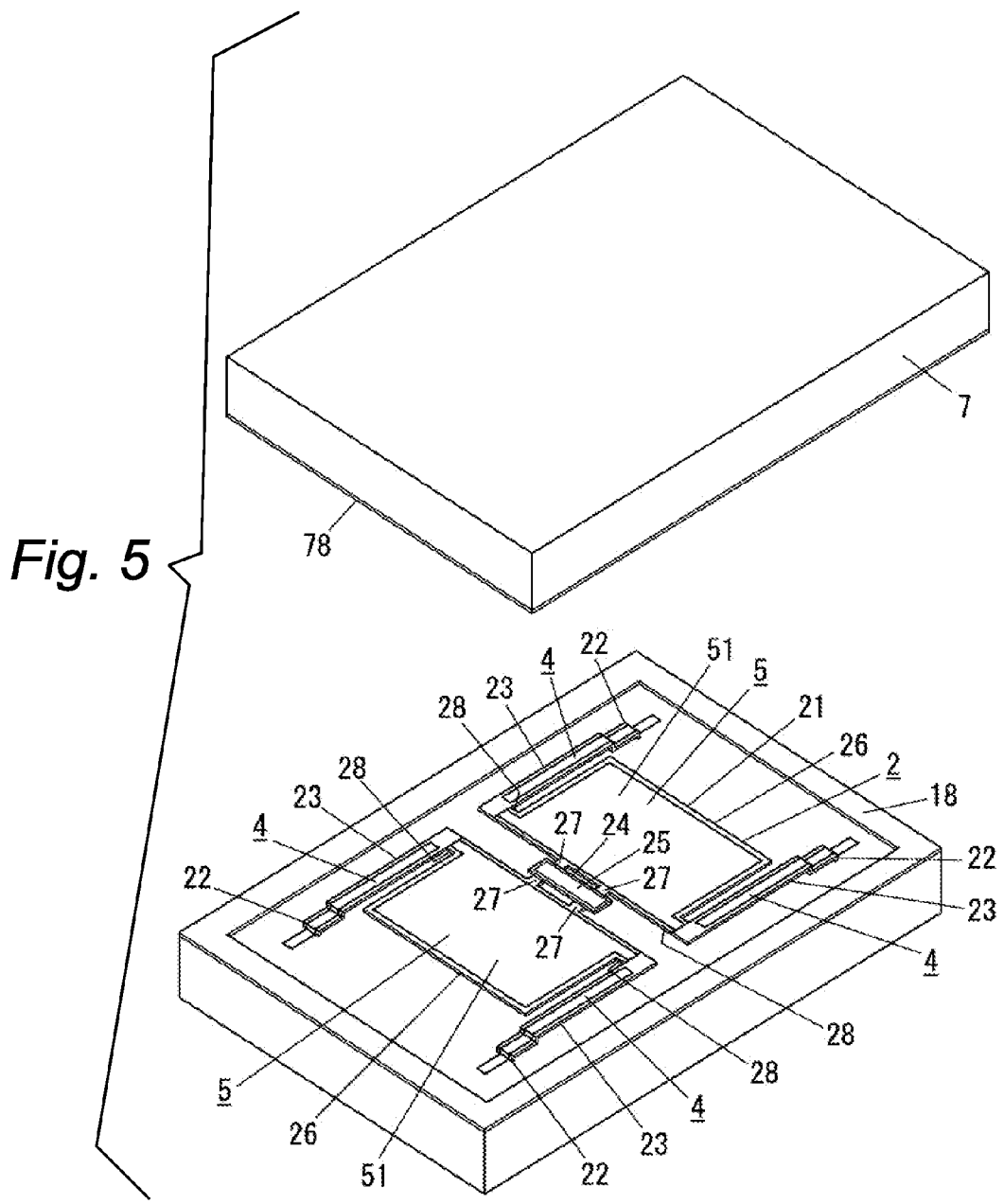
FIG. 5 shows a schematic exploded perspective view of the MEMS switch in a second embodiment.
Figure 6:
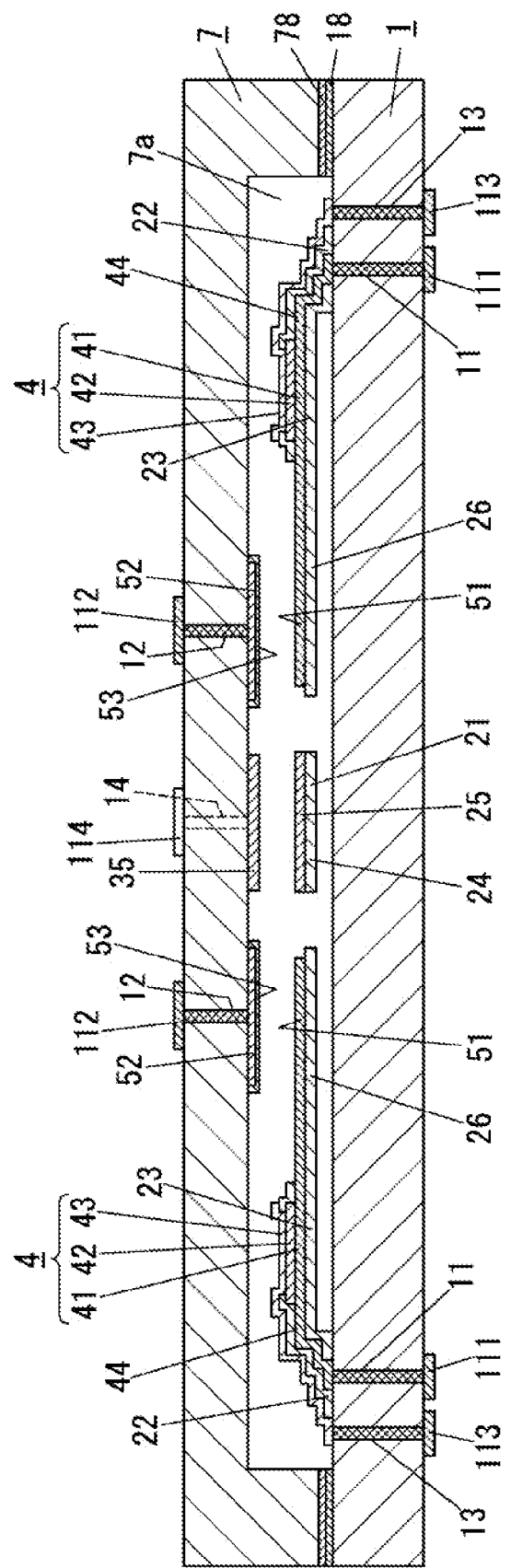
FIG. 6 shows a schematic side cross sectional view of the MEMS switch of the above.

Each one of FIG. 5 and FIG. 6 shows a MEMS switch in this embodiment. In this embodiment, the cover 7 is provided at its lower surface with a recess 7a which has an inside bottom surface. The signal wires 34 with the fixed contact 35 and each the static fixed electrode plate 51 are disposed on the inside bottom surface of the cover 7. The movable plate 21 is provided at its upper surface with the movable contact 25 and the static movable electrode plate 51. The components other than the above are in common with the components in the first embodiment. The components in common with the components in the first embodiment are designated by the same reference numerals in the first embodiment. Therefore, explanations of the components in common with the components in the first embodiment are omitted.

With this configuration, it is possible to prevent the noise which is caused by the first electrode 41, the second electrode, and the static movable electrode plate 51 from being superimposed on the signal which is transmitted through the signal wires 34, 34.

Hereinafter, the method of manufacturing the MEMS switch in this embodiment is explained with the attached FIG. 7 and FIG. 8. It is noted that the explanation of the steps in common with the steps in the first embodiment is arbitrarily omitted.

Figure 7A:
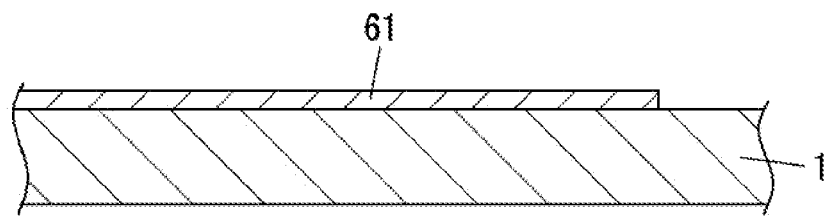
FIG. 7A to FIG. 7D show schematic side cross sectional views for explaining a main step of manufacturing the MEMS switch.

First, the bonding metal layer forming step of forming the first bonding metal layer 18 is performed. Subsequent to the bonding metal layer forming step, the sacrifice layer forming step of forming the sacrifice layer 61 for forming the movable plate 21 and the strips 23 on the upper surface side of the substrate 1 is performed. Consequently, the structure shown in FIG. 7A is prepared.

Figure 7B:
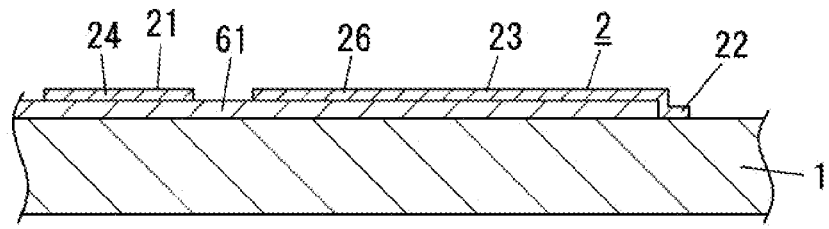

Subsequent to the sacrifice layer forming step, the movable plate forming step of forming the movable plate 21 and the strips 23 on the upper side of the substrate 1 is performed. Consequently, the structure shown in FIG. 7B is prepared. In the movable plate forming step, the step of forming the undoped polysilicon layer on the entire upper surface side of the substrate 1 by the method such as CVD method is performed. A part of the undoped polysilicon layer acts as the movable plate 21. Subsequent to the step of forming the undoped polysilicon layer, the step of patterning the polysilicon layer by the photolithography technique and the etching technique is performed. Consequently, the movable plate 21 and the strips 23 are formed.

Figure 7C:
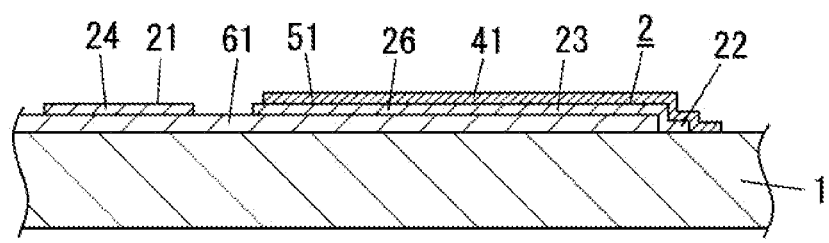

Subsequent to the movable plate forming step, the first electrode forming step is performed. In the first electrode forming step, the first electrode 41 is formed. Consequently, the structure shown in FIG. 7C is prepared. In the first electrode forming step, first, the step of forming the metal layer (such as PT layer) on the entire upper surface side of the substrate 1 by the sputtering method is performed. Subsequent to the step of forming the metal layer, the step of patterning the metal layer by the photolithography technique and the etching technique is performed. In this manner the first electrode 41 and the static movable electrode plate 51 of the static actuator 5 is prepared.

Figure 7D:
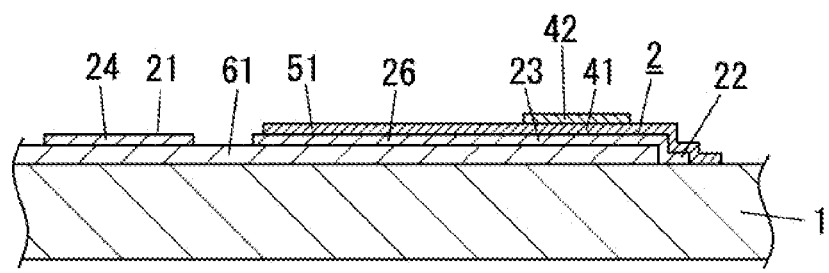
Figure 9:
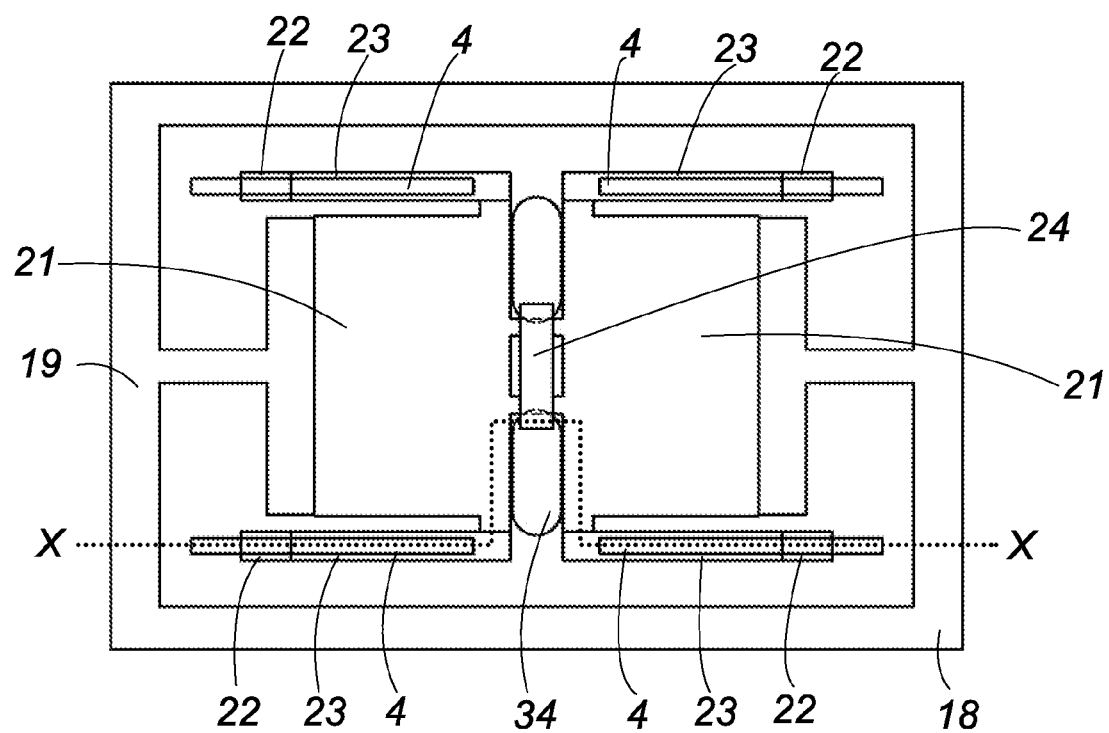
FIG. 9 shows a top view of the MEMS switch without cover in the first embodiment.

Subsequent to the first electrode forming step, the piezoelectric layer forming step is performed. In the piezoelectric layer forming step, the piezoelectric layer 42 is formed. Consequently, the structure shown in FIG. 7D is prepared. In the piezoelectric layer forming step, first, the step of forming the piezoelectric layer (such as PZT layer) by the method such as the sputtering method and the CVD method is performed. Subsequently, the step of patterning the piezoelectric layer by the photolithography technique and the etching technique is performed. Consequently, the piezoelectric layer 42 is prepared.

Subsequent to the piezoelectric layer forming step, the electrically insulation layer forming step is performed. In the electrically insulation layer forming step, the electrically insulation layer 44 having an opening 44a which defines the contact area which is created between the piezoelectric layer 42 and the second electrode 43 is formed. Consequently, the structure shown in FIG. 8A is prepared.

Subsequent to the electrically insulation layer forming step, the second electrode forming step is performed. In the second electrode forming step, the second electrode 43 is formed. Consequently, the structure shown in FIG. 8B is obtained. It should be noted that, in this embodiment, the piezoelectric actuator forming step is defined by the first electrode forming step, the piezoelectric layer forming step, and the second electrode forming step.

Subsequent to the second electrode forming step, the movable contact forming step is performed. In the movable contact forming step, the movable contact 25 is formed on the upper surface side of the substrate 1. Consequently, the structure shown in FIG. 8C is prepared. In the movable contact forming step, first, the step of forming the patterned resist film on the upper surface side of the substrate 1 is performed. The patterned resist film is shaped to expose the region for forming the movable contact 25. Subsequent to the step of forming the patterned resist film, the step of forming the movable contact 25 on the upper surface side of the substrate 1 by the nonelectrolytic plating method is performed. Finally, the lift-off step of removing the resist film and the plating film (metallic coating) on the resist film is performed.

Subsequent to the movable contact forming step, the sacrifice layer removing step is performed. In the sacrifice layer removing step, the sacrifice layer 61 is selectively removed. Consequently, the structure shown in FIG. 8D is prepared. As is obvious from FIG. 8D, the gap is left between the movable contact holding portion and the upper surface of the substrate 1. Similarly, the gap is left between each the strip 23 and the upper surface of the substrate 1.

Subsequent to the sacrifice layer removing step, the bonding step is performed. In the bonding step, the cover 7 with the signal wires 34, 34 and the static fixed electrode plate 52 is bond to the upper surface side of the substrate 1. Consequently, the MEMS switch having the structure shown in each one of FIG. 5 and FIG. 6.

According to the explanation of the method of manufacturing the MEMS switch, the movable contact 25 is formed after the piezoelectric actuator is formed on the first surface side of the substrate 1. Therefore, it is possible to determine the material of the movable contact regardless of the deposition temperature of the piezoelectric layer 42 of the piezoelectric actuator 4. Therefore, this method of manufacturing the MEMS switch has a high degree of freedom for the material of the movable contact 25.

The invention claimed is:

1. A MEMS switch comprising:
   a substrate having an upper surface;
   a pair of signal wires having fixed contacts respectively, said signal wires being located in an upper side of said substrate;
   a movable plate being located in an upper side of said substrate, said movable plate having a movable contact, said movable contact corresponding to said fixed contacts;
   a support member having flexibility, said support member being configured to support said movable plate to be movable upward and downward relative to said substrate
   a static actuator being configured to develop an electrostatic force for displacing said movable plate along a thickness direction of said substrate in order to allow said movable contact to come into contact with said fixed contacts;
   a piezoelectric actuator being configured to develop stress for displacing said movable plate in the thickness direction of said substrate in order to allow said movable contact to come into contact with said fixed contacts, wherein
said static actuator comprises a pair of static movable electrode plates and a pair of static fixed electrode plates, said static movable electrode plates being disposed on said movable plate, said static fixed electrode plates being disposed in an opposed relation to said static movable electrode plates,
said piezoelectric actuator comprising a piezoelectric element having a piezoelectric layer, a first electrode, and a second electrode, said first electrode being disposed on one surface of said piezoelectric layer and said second electrode being disposed on the other surface of said piezoelectric layer, said piezoelectric element being configured to be deformed when voltage is applied between said first electrode and said second electrode, thereby developing said stress,
said movable plate having a length and a width, said movable plate is provided at its lengthwise center with said movable contact, said movable plate is provided at its both lengthwise ends with movable electrode holding portions, said static movable electrode plates being disposed on said movable electrode holding portions respectively,
said support member comprising four strips, each said strips having the flexibility, said strips being disposed at portions being located at outsides of both width ends of said movable plate and being located at outsides of said movable electrode holding portions,
said strips being arranged along a lengthwise direction of said movable plate, each said strip being provided with a first end and a second end, said first end is located at a longitudinal center of the substrate, said second end is opposite of said first end, each said first end being coupled to said movable plate through a coupling plate, said second end being coupled to said substrate,
each said piezoelectric element being disposed on an upper surface of each said strip, whereby each said piezoelectric element being located in an outside of the both width ends of said movable plate,
said piezoelectric elements applies the stress to coupling portions, defined by said coupling plate, between said strip and said movable plate when said piezoelectric element develops the stress.

2. The MEMS switch as set forth in claim 1, wherein
said static actuator having a dimension which is larger than a dimension of upper surfaces of said piezoelectric elements.

3. The MEMS switch as set forth in claim 1, wherein
said piezoelectric actuators are configured to have identical structures of being attached to said strips, respectively.

4. The MEMS switch as set forth in claim 1, wherein
each said fixed contact is electrically insulated from said electrodes of said piezoelectric actuator.

5. The MEMS switch as set forth in claim 1, wherein
each said fixed contact is electrically insulated from said static movable electrode plate of said static actuator, and
each said fixed contact being electrically insulated from said static fixed electrode plate of said static actuator.

6. The MEMS switch as set forth in claim 1, wherein
said MEMS switch further comprises a ground electrode,
said piezoelectric actuator and said static actuator shares said ground electrode.

7. The MEMS switch as set forth in claim 1, wherein
said piezoelectric layer is made of a lead-based piezoelectric material.

8. The MEMS switch as set forth in claim 1, wherein
said movable plate further comprises a movable contact holding portion and coupling portions,
said movable contacts being disposed on said movable contact holding portion,
said movable contact holding portion being located between said movable electrode holding portions, said movable contact holding portion being coupled to said movable electrode holding portions via said coupling portions,
each said coupling portions has a width which is smaller than widths of said movable contact holding portions, and
each said coupling portions has the width which is smaller than widths of said movable electrode holding portion.

9. The MEMS switch as set forth in claim 1, wherein
said movable plate has a cutout which is shaped to expose a portion other than said fixed contacts, whereby said portion other than said fixed contacts being exposed to an upper direction.

10. The MEMS switch as set forth in claim 1, wherein
both said signal wires and said static fixed electrode plates are disposed on said substrate,
each said signal wires being disposed on the same plane of said substrate, and
said signal wires having thickness which are equal to each other.

11. The MEMS switch as set forth in claim 1, wherein
said MEMS switch further comprises a cover which is provided at its lower surface with a recess, said cover being cooperative with said substrate to incorporate said movable plate between said substrate and said cover,
said signal wires and said static fixed electrode plates are disposed on an inside surface of said cover.

12. A method of manufacturing the MEMS switch as set forth in claim 10, said method of manufacturing the MEMS switch comprising:
a fixed electrode forming step of forming said static fixed electrode plate on said upper surface of said substrate,
a signal wires forming step of forming a pair of said signal wires on said upper surface of said substrate, said signal wires being provided with said fixed contacts, said signal wire forming step being performed subsequent to said fixed electrode forming step,
a sacrifice layer forming step of forming a sacrifice layer on said upper surface of said substrate, said sacrifice layer being used for forming said movable plate, said sacrifice layer forming step being performed subsequent to said a sacrifice layer forming step,
a movable electrode forming step of forming said static movable electrode plate on said upper surface of said substrate, said movable electrode forming step being performed subsequent to said sacrifice layer forming step,
a movable contact forming step of forming said movable contact, said movable contact forming step being performed subsequent to said movable electrode forming step,
a movable plate forming step of forming said movable plate, said movable plate forming step being performed subsequent to said movable contact forming step,
a first electrode forming step of forming said first electrode of said piezoelectric actuator, said first electrode forming step being performed subsequent to said movable plate forming step, a piezoelectric layer forming step of forming said piezoelectric layer, said piezoelectric layer forming step being performed subsequent to said first electrode forming step, a second electrode forming step of forming said second electrode of said piezoelectric actuator, said second electrode forming step being performed subsequent to said piezoelectric layer forming step, and a sacrifice layer removing step of removing said sacrifice layer.

13. A method of manufacturing the MEMS switch as set forth in claim 11, said method of manufacturing the MEMS switch comprising:

a sacrifice layer forming step of forming a sacrifice layer on an upper surface side of said substrate, said sacrifice layer being used for forming said movable plate, a movable plate forming step of forming said movable plate on said upper surface side of said substrate, said movable plate forming step being performed subsequent to said sacrifice layer forming step, a first electrode forming step of forming said static movable electrode plate and said first electrode of said piezoelectric actuator, said first electrode forming step being performed subsequent to said movable plate forming step, a piezoelectric layer forming step of forming said piezoelectric layer, said piezoelectric layer forming step being performed subsequent to said first electrode forming step, a second electrode forming step of forming said second electrode of said piezoelectric actuator, said second electrode forming step being performed subsequent to said piezoelectric layer forming step, a movable contact forming step of forming a movable contact on said movable plate, said movable contact forming step being performed subsequent to said second electrode forming step, a sacrifice layer removing step of removing said sacrifice layer, said sacrifice layer removing step being performed subsequent to said movable contact forming step, and a bonding step of bonding said cover to said upper surface of said substrate, said cover being provided with said static fixed electrode plate and a pair of said signal wires with said fixed contact, said coupling step being performed subsequent to said sacrifice layer removing step.

* * * * *